(12) United States Patent
Lee et al.

(10) Patent No.: US 8,164,127 B2
(45) Date of Patent: Apr. 24, 2012

(54) IMAGE SENSOR INCLUDING A PIXEL CELL HAVING AN EPITAXIAL LAYER, SYSTEM HAVING THE SAME, AND METHOD OF FORMING A PIXEL CELL

(75) Inventors: Kyung-Ho Lee, Hwasung (KR); Kwang-il Jung, Hwasung (KR); Jung-Chak Ahn, Hwasung (KR); Yi-Tae Kim, Hwasung (KR); Kyoung-Sik Moon, Hwasung (KR); Bum-Suk Kim, Hwasung (KR); Young-Bae Kee, Hwasung (KR); Dong-Young Lee, Hwasung (KR); Tae-Sub Jung, Hwasung (KR); Kang-Sun Lee, Hwasung (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 309 days.

(21) Appl. No.: 12/585,501

(22) Filed: Sep. 16, 2009

(65) Prior Publication Data

US 2010/0065896 A1     Mar. 18, 2010

(30) Foreign Application Priority Data

Sep. 17, 2008   (KR) .................. 10-2008-0090981

(51) Int. Cl.
*H01L 31/113*   (2006.01)

(52) U.S. Cl. .......................................... 257/292; 257/463
(58) Field of Classification Search .................. 257/292
See application file for complete search history.

(56) References Cited

U.S. PATENT DOCUMENTS

| 5,898,196 | A | 4/1999 | Hook et al. | |
|---|---|---|---|---|
| 2003/0141526 | A1* | 7/2003 | Rhodes | 257/292 |
| 2007/0037313 | A1* | 2/2007 | Lee | 438/57 |
| 2007/0045682 | A1* | 3/2007 | Hong et al. | 257/292 |
| 2007/0108371 | A1* | 5/2007 | Stevens et al. | 250/214.1 |

FOREIGN PATENT DOCUMENTS

KR   10-0684878   2/2007

* cited by examiner

*Primary Examiner* — Matthew Landau
*Assistant Examiner* — Robert Bachner
(74) *Attorney, Agent, or Firm* — Harness, Dickey & Pierce, P.L.C.

(57) ABSTRACT

A pixel cell includes a substrate, an epitaxial layer, and a photo converting device in the epitaxial layer. The epitaxial layer has a doping concentration profile of embossing shape, and includes a plurality of layers that are stacked on the substrate. The photo converting device does not include a neutral region that has a constant potential in the vertical direction. Therefore, the image sensor including the pixel cell has high quantization efficiency, and a crosstalk between photo-converting devices is decreased.

17 Claims, 11 Drawing Sheets

IMAGE SENSOR INCLUDING A PIXEL CELL HAVING AN EPITAXIAL LAYER, SYSTEM HAVING THE SAME, AND METHOD OF FORMING A PIXEL CELL

CROSS-REFERENCE TO RELATED APPLICATIONS

This application claims priority under 35 USC §119 to Korean Patent Application No. 10-2008-0090981, filed on Sep. 17, 2008 in the Korean Intellectual Property Office (KIPO), the entire contents of which are incorporated herein by reference.

BACKGROUND

1. Technical Field

The embodiments relate to an image sensor, and more particularly to a pixel cell having a plurality of epitaxial layers, a CMOS image sensor including the pixel cell, and a method of forming a pixel cell of the CMOS image sensor.

2. Description of the Related Art

A complementary metal oxide semiconductor (CMOS) image sensor is widely used as an image capturing device because it has low operating voltage, low power consumption, and low production cost. The CMOS image sensor includes a pixel cell array composed of a plurality of pixel cells. Each of the pixel cells may include a photo diode, a transfer transistor, a reset transistor, a source follower transistor and a row selecting transistor. The photo diode includes a charge accumulating portion that accumulates charge generated by a light.

A thick epitaxial layer is required to decrease loss in a silicon area of electrons generated by a light incident on the photo diode. However, when the thickness of the epitaxial layer is increased, a cross-talk between neighboring photo diodes may be increased. Therefore, the effective depth of the photo diode needs to be increased to decrease the cross-talk between the photo diodes.

Conventionally, ion implantation process has been performed using simply a high energy, and thus a phenomenon called blooming may be caused between photo diodes when a distance between the neighboring photo diodes is relatively short. The blooming is a phenomenon where electrons overflow between the photo diodes. A photo diode may be formed in a stepped epitaxial layer or in a graded epitaxial layer using a count-doping method without additional photo processes.

However, in the pixel cell of an image sensor having a stepped epitaxial layer or a graded epitaxial layer, there is a limit to the degree to which an effective depth of the photo diode region can be increased by raising energy of an ion beam in the ion implantation process.

SUMMARY

Accordingly, example embodiments are provided to substantially obviate one or more problems due to limitations and disadvantages of the related art.

Example embodiments may provide a pixel cell that has high quantization efficiency and little crosstalk between pixel cells.

Example embodiments may also provide an image sensor having the pixel cell.

Example embodiments may also provide a system having the image sensor.

Example embodiments may also provide a method of forming a pixel cell that has high quantization efficiency and little crosstalk between pixel cells.

According to example embodiments, a pixel cell includes a substrate, an epitaxial layer, and a photo converting device. The epitaxial layer has a doping concentration profile of embossing shape, and includes a plurality of layers that are stacked on the substrate. The photo converting device is in the epitaxial layer.

According to example embodiments, the photo converting device in the epitaxial layer may not include a neutral region that has a constant potential in a vertical direction.

According to example embodiments, the photo converting device may include a photo-diode region in the epitaxial layer and has a conductivity type opposite to a conductivity type of the epitaxial layer.

According to example embodiments, the photo converting device may further include a surface layer on the photo-diode region and has a conductivity type identical to the conductivity type of the epitaxial layer.

According to example embodiments, the epitaxial layer may include a first epitaxial layer, a second epitaxial layer and a third epitaxial layer.

The first epitaxial layer may have a first conductivity type and a first doping concentration. The second epitaxial layer may have the first conductivity type and may be on the first epitaxial layer and has a second doping concentration that is higher than the first doping concentration. The third epitaxial layer may, have the first conductivity type and may be on the second epitaxial layer, and may have a third doping concentration that is lower than the second doping concentration.

According to example embodiments, the third doping concentration may be lower than the first doping concentration.

According to example embodiments, the substrate may have the first conductivity type.

According to example embodiments, the photo converting device may be a photo-diode.

According to example embodiments, the pixel cell may further include a transfer transistor, a source follower transistor and a reset transistor.

The transfer transistor may transfer charge generated by the photo converting device to a first node. The source follower transistor may amplify a voltage signal of the first node. The reset transistor may reset the voltage signal of the first node.

According to example embodiments, the pixel cell may further include a row selecting transistor that outputs an output signal of the source follower transistor to an output terminal in response to a selecting signal.

According to example embodiments, an image sensor may include a row driver, a column driver and a pixel array.

The row driver may generate a row selecting signal. The column driver may generate a column selecting signal. The pixel array may operate in response to the row selecting signal and the column selecting signal, and include at least one pixel cell. The pixel cell may include a substrate, an epitaxial layer, and a photo converting device in the epitaxial layer. The epitaxial layer may have a doping concentration profile of embossing shape, and include at least one layer stacked on the substrate.

According to example embodiments, the epitaxial layer may include a first epitaxial layer, a second epitaxial layer and a third epitaxial layer.

The first epitaxial layer may have a first conductivity type and a first doping concentration. The second epitaxial layer may have the first conductivity type and may be on the first epitaxial layer and has a second doping concentration that is higher than the first doping concentration. The third epitaxial layer may have the first conductivity type and may be on the second epitaxial layer, and may have a third doping concentration that is lower than the second doping concentration.

According to example embodiments, a system may include a processor and an image sensor coupled to the processor. The image sensor includes a substrate, an epitaxial layer having a doping concentration profile of embossing shape and including at least one layer stacked on the substrate, and a photo converting device in the epitaxial layer.

According to example embodiments, a method of forming a pixel cell of an image sensor may include forming a substrate, forming an epitaxial layer having a doping concentration profile of embossing shape and including a plurality of layers that are stacked on the substrate, and forming at least one pixel cell that includes a photo converting device in the epitaxial layer.

According to example embodiments, the forming an epitaxial layer may include forming a first epitaxial layer having a first conductivity type and a first doping concentration on the substrate, forming a second epitaxial layer having the first conductivity type and a second doping concentration that is higher than the first doping concentration on the first epitaxial layer, and forming a third epitaxial layer having the first conductivity type and a third doping concentration that is lower than the second doping concentration on the second epitaxial layer.

Therefore, the image sensor according to example embodiments may be formed so that the effective depth of the n-type photo diode region NPD is deeper than the conventional image sensor even if ion implantation is performed using the same energy because the image sensor includes the epitaxial layers EPI_1, EPI_2 and EPI_3 having a doping concentration profile of embossing shape. Therefore, the image sensor according to example embodiments may have high quantization efficiency, and a photo-converting device in the image sensor may have a large or maximum depth without blooming, and crosstalk between photo-converting devices may be decreased.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF THE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are Intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
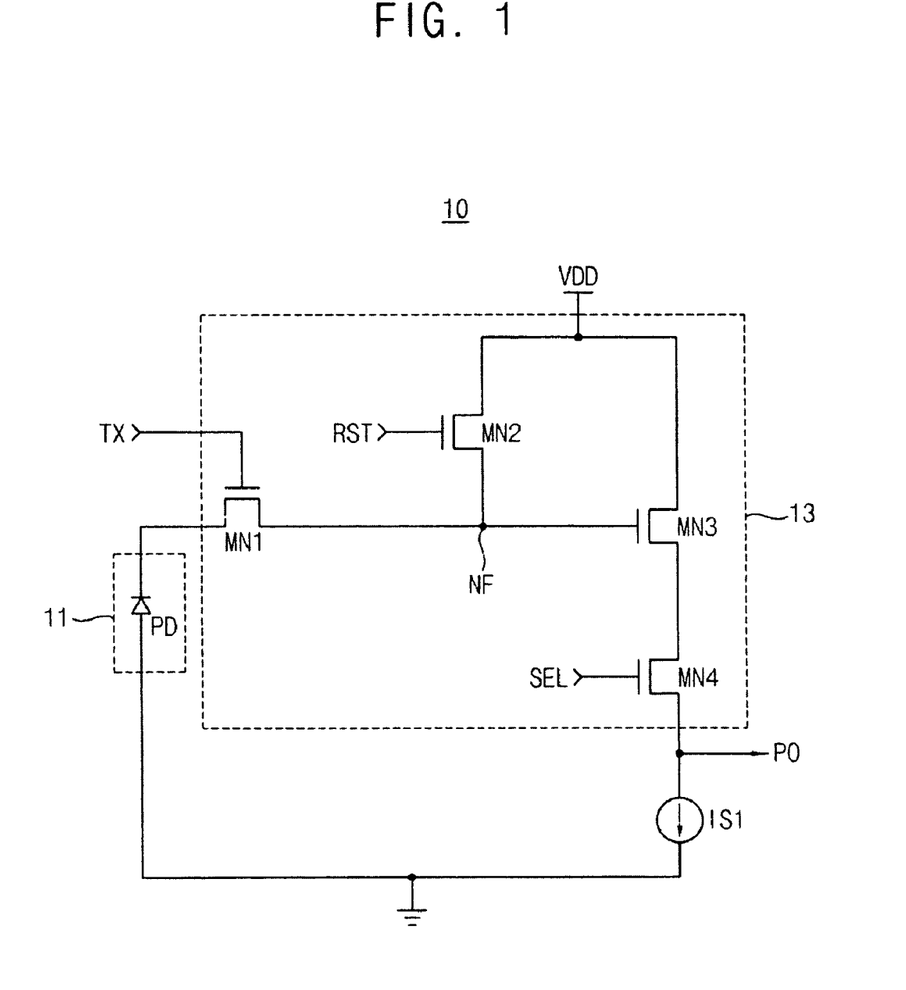
FIG. 1 is a circuit diagram illustrating a pixel cell of a CMOS image sensor according to example embodiments.

FIG. 1 is a circuit diagram illustrating a pixel cell 10 of a CMOS image sensor according to an example embodiment.

Referring to FIG. 1, the pixel cell 10 of a CMOS image sensor may include a photo converting device 11, a transfer transistor MN1, a reset transistor MN2, a source follower transistor MN3 and a row selecting transistor MN4. The photo converting device 11 may include a photo diode PD. A current source IS1 may be coupled between the row selecting transistor MN4 and the ground. As is discussed in greater detail below, the pixel cell 10 of a CMOS image sensor that includes the photo converting device 11 may be formed in a plurality of epitaxial layers having a doping concentration profile of embossing shape.

As shown in FIG. 1, the pixel cell 10 of a CMOS image sensor may include a photo converting device 11 including a photo diode PD, and a signal processing circuit 13 that is composed of the transfer transistor MN1, the reset transistor MN2, the source follower transistor MN3 and the row selecting transistor MN4.

A CMOS image sensor may include a plurality of pixel cells as shown in FIG. 1, decoders, driving circuits, control circuits, an analog-to-digital converter and an image processor. An image sensor chip having the pixel cell 10 of a CMOS image sensor may have a photo converting device region including a plurality of photo converting devices and a signal processing circuit region including a plurality of signal processing circuits.

Hereinafter, the operation of the pixel cell 10 of a CMOS image sensor shown in FIG. 1 will be described.

When the light is incident on the photo diode PD, charge is accumulated on an output terminal of the photo diode PD. When the current flows between the photo diode PD and a floating node NF, the electric potential of the floating node NF may be changed and the output signal PO may be determined according to the electric potential of the floating node NF. The output signal PO may be a signal corresponding to one pixel data of an image data.

When the reset signal RST is logic "low" and the transfer signal TX is logic "high", and the light is incident on the photo diode PD, a current may begin to flow through the photo diode PD. The reset transistor MN2 is in off state and the transfer transistor MN1 is in on state because the reset signal RST is logic "low" and the transfer signal TX is logic "high". Therefore, a voltage signal of a gate terminal of the source follower transistor MN4 may be decreased. When a row selecting signal SEL is turned to logic "high" the row selecting transistor MN4 is turned on and the voltage level of the output signal PO is determined depending on the voltage signal of the gate terminal of the source follower transistor MN3. The floating node NF may be reset by the reset transistor MN2 before sensing the next image. As the intensity of the light that is incident on the photo diode PD becomes higher, the magnitude of the gate terminal of the source follower transistor MN3 may become lower and the magnitude of the output signal PO may become lower.

Figure 2:
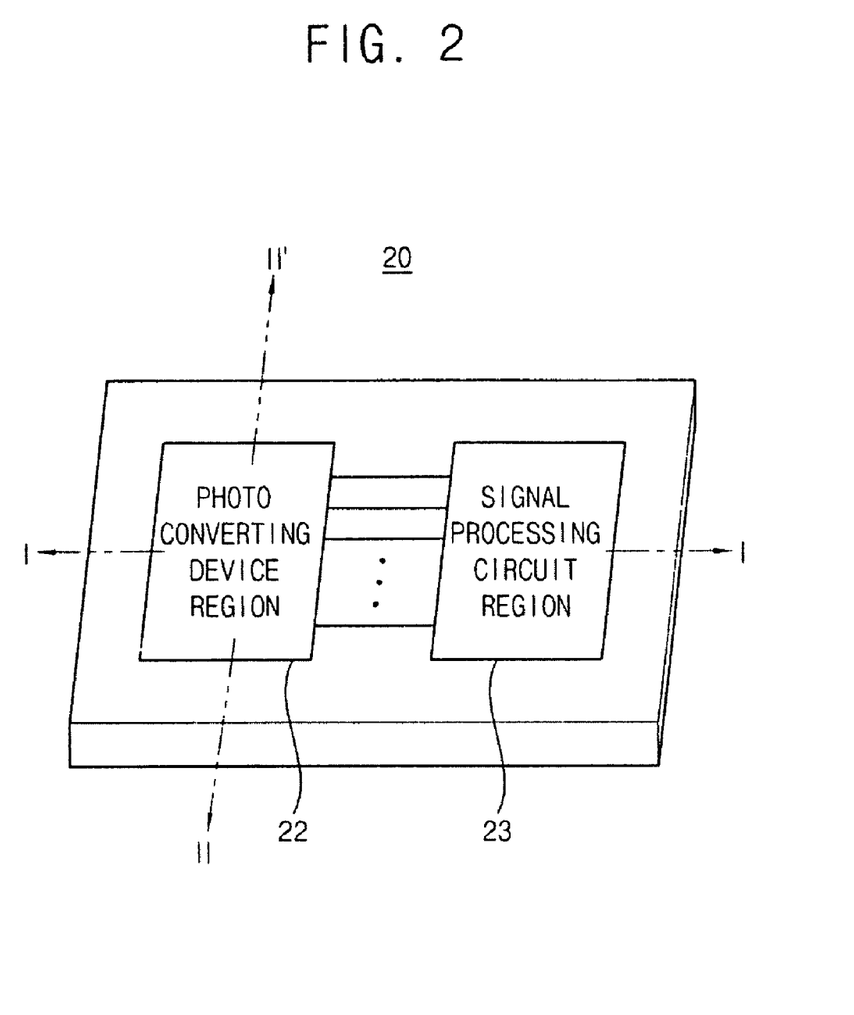
FIG. 2 is a perspective view illustrating a structure of a CMOS image sensor chip having a plurality of pixel cells according to example embodiments.

FIG. 2 is a perspective view illustrating a structure of a CMOS image sensor chip 20 having a plurality of pixel cells.

Referring to FIG. 2, the image sensor chip 20 having a pixel cell 10 of a CMOS image sensor may include a photo converting device region 22 including a plurality of photo converting devices and a signal processing circuit region 23 including a plurality of signal processing circuits. In the photo converting device region 22, a plurality of photo converting devices having the same structure and operation of photo converting device 11 shown in FIG. 1 may be arranged along the line I-I'. The signal processing circuit region 23 may have a plurality of signal processing circuits having the same structure and operation of signal processing circuit 13 shown in FIG. 1, each of which include the transfer transistor MN1, the reset transistor MN2, the source follower transistor MN3 and the row selecting transistor MN4.

Figure 3:
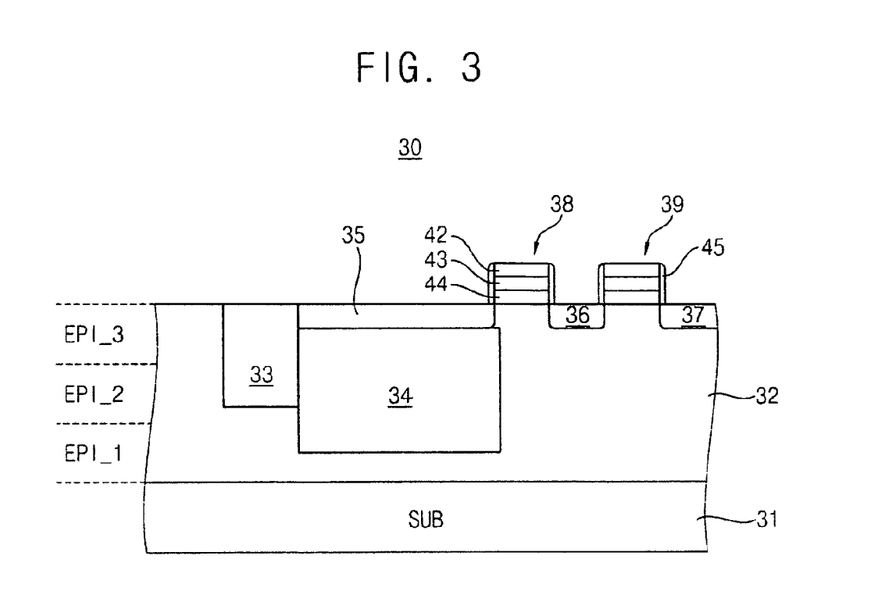
FIG. 3 is a cross sectional view of the CMOS image sensor chip of FIG. 2 cutting along a line I-I' according to example embodiments.

FIG. 3 is a cross sectional view of the CMOS image sensor chip 20 of FIG. 2 cutting along a line I-I'.

Referring to FIG. 3, the vertical structure 30 of the CMOS image sensor chip may include a heavily doped p-type substrate (SUB) 31, and an epitaxial layer 32 formed on the heavily doped p-type substrate (SUB) 31. The epitaxial layer 32 may include three p-type layers EPI_1, EPI_2 and EPI_3. Further, the vertical structure 30 of the CMOS image sensor chip may include an n-type photo diode region 34 formed in the epitaxial layer 32, a p-type surface layer 35, a transfer transistor 38 and a reset transistor 39.

Further, the vertical structure 30 of the CMOS image sensor chip may include a floating diffusion region 36, a drain region 37 of the reset transistor 39 and a shallow trench isolation region (STI) 33. The STI 33 may electrically isolate a pixel cell shown in FIG. 3 from neighborhood pixel cells. The floating diffusion region 36 may function as a drain region of the transfer transistor 38 and a source region of the reset transistor 39.

The source follower transistor MN3 and the row selecting transistor MN4 of FIG. 1 are not illustrated in FIG. 3. A gate of the source follower transistor MN3 may be electrically connected to the floating diffusion region 36, and a drain of the row selecting transistor MN4 may be electrically connected to a source of the source follower transistor MN3.

The n-type photo diode region 34 may be located in the p-type epitaxial layer 32 under the p-type surface layer 35. The transfer transistor 38 and the reset transistor 39 may include a first oxide layer 44, a conductive layer 43 formed on the first oxide layer 44, a second oxide layer 42 formed on the conductive layer 43 and a sidewall dielectric 45.

Figure 4:
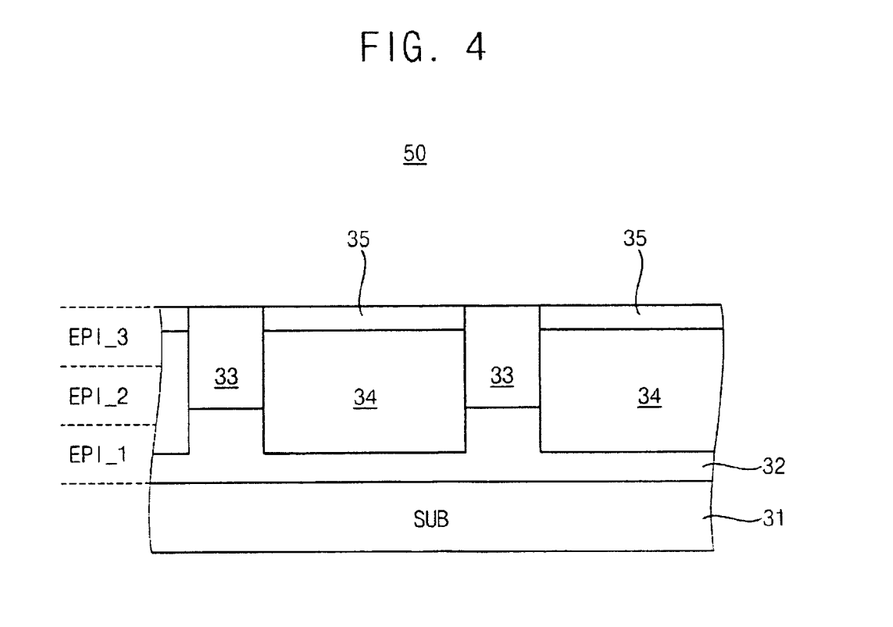
FIG. 4 is a cross sectional view of the CMOS image sensor chip of FIG. 2 cutting along a line II-II' according to example embodiments.

FIG. 4 is a cross sectional view of the CMOS image sensor chip 20 of FIG. 2 cutting along a line II-II'.

Referring to FIG. 4, the vertical structure 50 of the CMOS image sensor chip may include the heavily doped p-type substrate (SUB) 31, and the epitaxial layer 32 formed on the heavily doped p-type substrate (SUB) 31. The epitaxial layer 32 may include three p-type layers EPI_1, EPI_2 and EPI_3. Further, the vertical structure 50 of the CMOS image sensor chip may include the n-type photo diode region 34 formed in the epitaxial layer 32, and the p-type surface layer 35.

Further, the vertical structure 50 of the CMOS image sensor chip may include the shallow trench isolation region (STI) 33 that electrically isolates a pixel cell shown in FIG. 4 from neighboring pixel cells. The n-type photo diode region 34 may be located in the p-type epitaxial layer 32 under the p-type surface layer 35.

Referring to FIGS. 3 and 4, as illustrated by vertical structures 30 and 50 of the CMOS image sensor chip 20, the CMOS image sensor chip 20 according to example embodiments may include an epitaxial layer having the three layers EPI_1, EPI_2 and EPI_3 on the p-type substrate 31. As described later, the second epitaxial layer EPI_2 may have a doping concentration higher than the first epitaxial layer EPI_1 and the third epitaxial layer EPI_3.

When light is incident on the pixel cell of a CMOS image sensor chip, electron-hole pairs may be generated in the neighborhood of the junction of the epitaxial layers 32 and the n-type photo diode regions 34. Holes may flow through the p-type substrates 31 to the ground, and electrons may accumulate in the n-type photo diode regions 34, and be transferred through the transfer transistor 38 to the floating diffusion region 36 when the transfer transistor 38 is turned on.

As shown in FIG. 4, the n-type photo diode regions 34 may be arranged in a line, between the STIs 33. In the conventional CMOS image sensor chip, a cross-talk may be generated between photo diode regions because the conventional CMOS image sensor chip includes an epitaxial layer that has a constant doping concentration.

The effective depth of the n-type photo diode regions 34 of the CMOS image sensor chip according to example embodiments may be deeper than that of a conventional CMOS image sensor chip because the CMOS image sensor chip according to example embodiments may have a doping concentration profile of an embossing shape. Therefore, electrons generated in the lower portion of the n-type photo diode region 34 may not flow to the neighbored n-type photo diode region 34, and may be accumulated in the n-type photo diode region 34 where the electrons are generated. Therefore, in the CMOS image sensor chip according to example embodiments, the cross-talk between neighboring photo diodes may be decreased.

Figure 5:
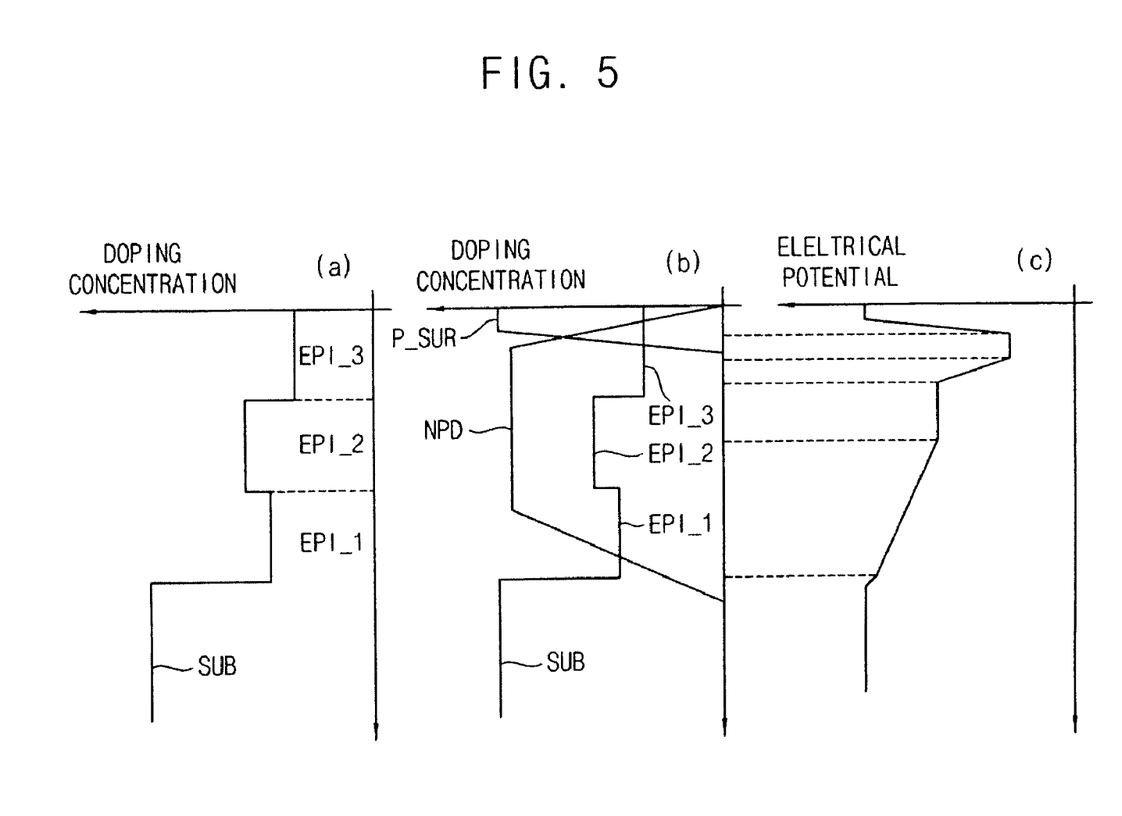
FIG. 5 illustrates doping concentration profiles and a potential profile of a vertical structure of an image sensor according to example embodiments.

FIG. 5 illustrates examples of doping concentration profiles and a potential profile of a vertical structure of an image sensor according to example embodiments. The graph (a) illustrates an example of a doping concentration profile of a p-type substrate SUB and the epitaxial layers EPI_1, EPI_2 and EPI_3. The graph (b) illustrates an example of a doping concentration profile of the p-type substrate SUB, the epitaxial layers EPI_1, EPI_2 and EPI_3, the n-type photo diode region NPD 34 and the p-type surface region P_SUR. The graph (c) illustrates an example of a potential profile of a vertical structure of an image sensor according to an example embodiment.

Referring to the graph (a), in the vertical structure of an image sensor according to an example embodiment, the doping concentration profile of the epitaxial layers EPI_1, EPI_2 and EPI_3 may have an embossing shape. According to example embodiments, the doping concentration of EPI_2 may be higher than the doping concentration of EPI_1 and EPI_3, and the doping concentration of EPI_2 may be lower than the doping concentration of the substrate SUB. For example, the doping concentration of the substrate SUB may be $5*10^{17}$ atoms/cm3, the doping concentration of EPI_1 may be $5*10^{14}$ atoms/cm3, the doping concentration of EPI_2 may be $1*10^{16}$ atoms/cm3, and the doping concentration of EPI_3 may be $1*10^{14}$ atoms/cm3. The doping concentration of EPI_3 may be lower than or equal to the doping concentration of EPI_1.

Figure 6:
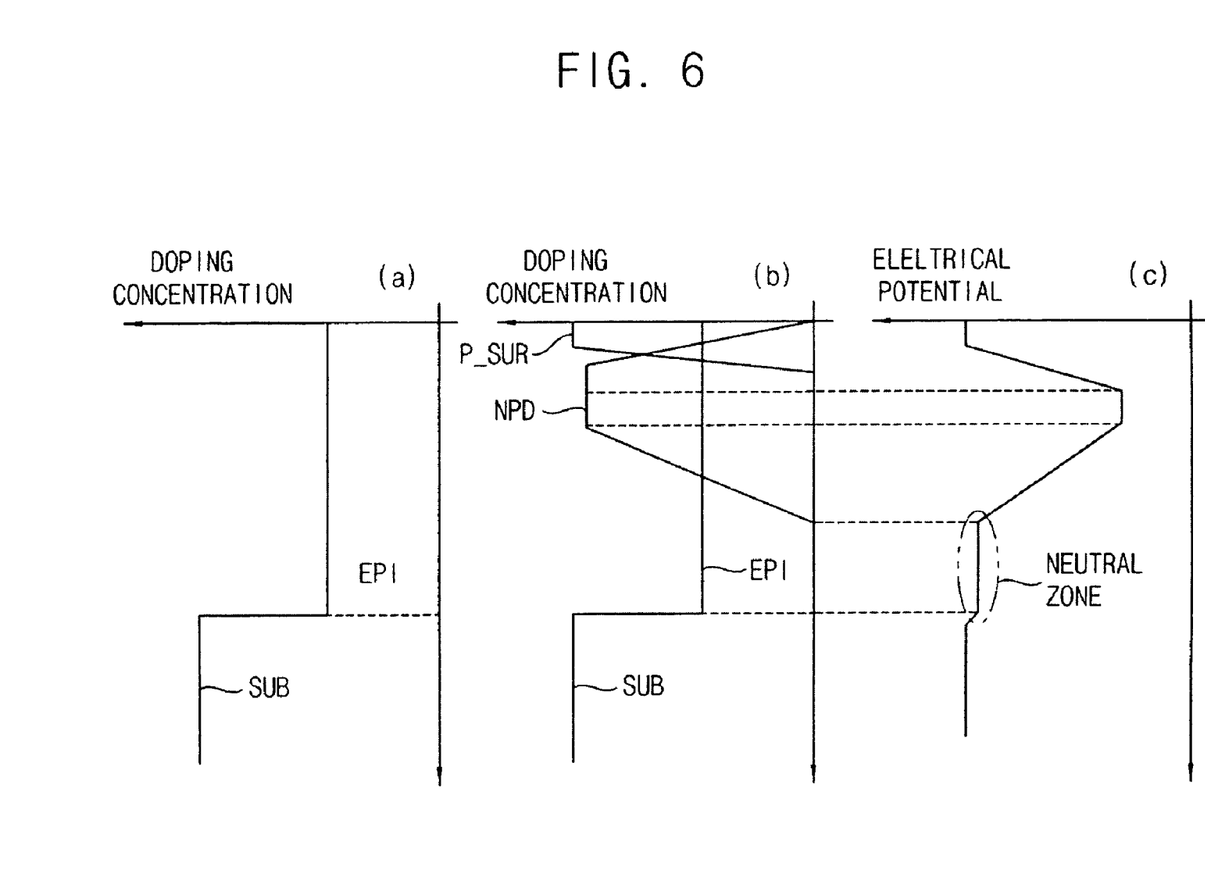
FIG. 6 illustrates doping concentration profiles and a potential profile of a vertical structure of a conventional image sensor using stepped epitaxial layers according to example embodiments.

FIG. 6 illustrates examples of doping concentration profiles and a potential profile of a vertical structure of a conventional image sensor using stepped epitaxial layers. The graph (a) illustrates an example of a doping concentration profile of a p-type substrate SUB and the epitaxial layer EPI. The graph (b) illustrates an example of a doping concentration profile of the p-type substrate SUB, the epitaxial layer EPI, the n-type photo diode region NPD and the p-type surface region P_SUR. The graph (c) illustrates an example of a potential profile of a vertical structure of a conventional image sensor.

Referring to the graph (c) in FIG. 6, a neutral region NEUTRAL ZONE in which a potential is constant in a vertical direction exists in the conventional epitaxial layer adjacent to the p-type substrate SUB in FIG. 6. When the neutral region exists in the epitaxial layer adjacent to the p-type substrate SUB, some of the electrons that are in the epitaxial layer adjacent to the p-type substrate SUB may flow into the n-type photo diode region NPD of a neighboring photo-converting device. This phenomenon is called a crosstalk. When the crosstalk is caused, the image sensor may output distorted data.

Referring to the graphs (a) and (b) in FIG. 5, the image sensor according to example embodiments includes epitaxial layers EPI_1, EPI_2 and EPI_3 having a doping concentration profile of embossing shape. Therefore, as shown in the graph (c) in FIG. 5, a neutral region in which a potential is constant does not exist in the epitaxial layer EPI_1 adjacent to the p-type substrate SUB. If the neutral region does not exist in the epitaxial layer EPI_1 adjacent to the p-type substrate SUB, electrons generated at the junction of the p-type substrate SUB and the epitaxial layer EPI_1 may easily flow into the corresponding n-type photo diode region NPD. Therefore, the image sensor having the doping concentration profile of embossing shape according to example embodiments as shown in FIG. 5 may decrease crosstalk.

As shown in FIG. 5, in the image sensor according to example embodiments, the effective depth of the n-type photo diode region NPD may be formed deeper than the conventional image sensor even if ion implantation is performed using the same energy because the image sensor may include the epitaxial layers EPI_1, EPI_2 and EPI_3 having a doping concentration profile of embossing shape. The image sensor does not have the neutral region, that is, the region in which a potential is constant in a vertical direction because the image sensor may include the first epitaxial layer EPI_1 which is between the p-type substrate SUB and the second epitaxial layer EPI_2, having a doping concentration lower than the doping concentration of the p-type substrate SUB and the second epitaxial layer EPI_2.

Conventionally, the ion implantation has been performed using high energy to increase the depth of the n-type photo diode region NPD. However, there may be a limit to the degree to which an effective depth of the photo diode region can be increased by increasing energy of an ion implantation process.

FIGS. 7A through 7H are diagrams illustrating processes of fabricating the CMOS image sensor shown in FIG. 2.

Referring to FIGS. 7A through 7H, a method of forming a pixel cell of an image sensor may include forming a substrate 31, forming an epitaxial layer having a doping concentration profile of embossing shape composed of a plurality of layers 32a, 32b and 32c that are stacked on the substrate 31, and forming at least one pixel cell that includes a photo converting device in the epitaxial layer.

Figure 7A:
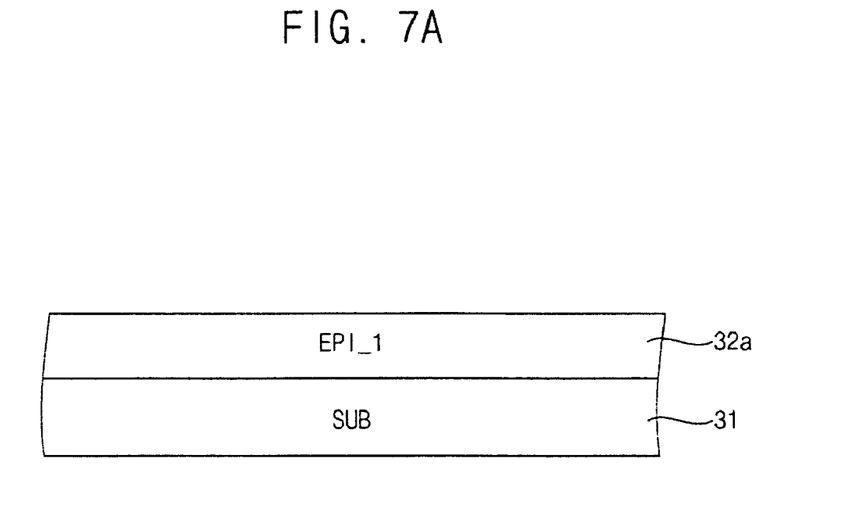
FIGS. 7A through 7H are diagrams illustrating processes of fabricating the CMOS image sensor shown in FIG. 2 according to example embodiments.
Figure 7B:
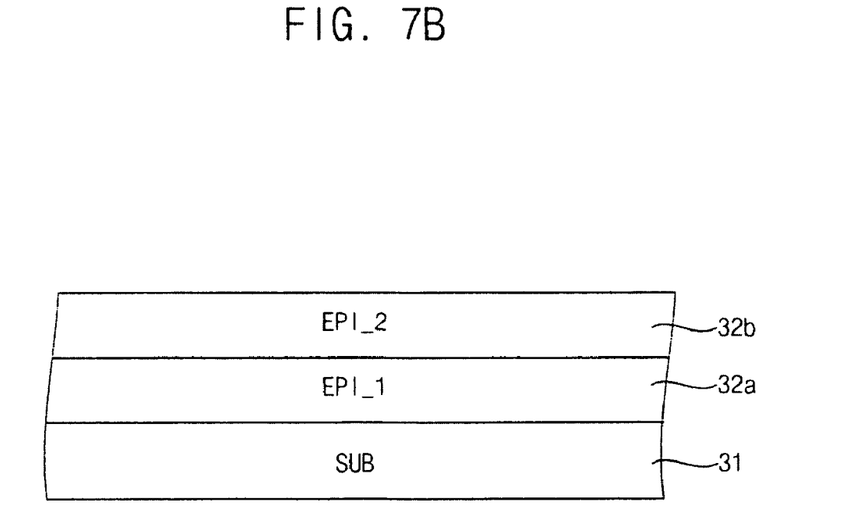
Figure 7C:
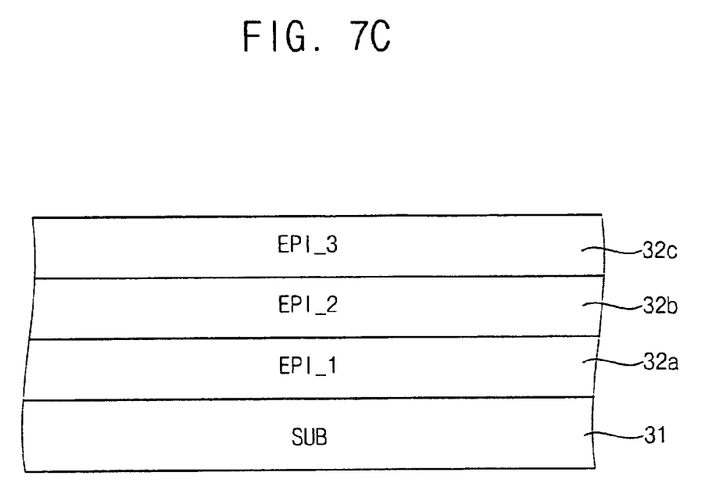
Figure 7D:
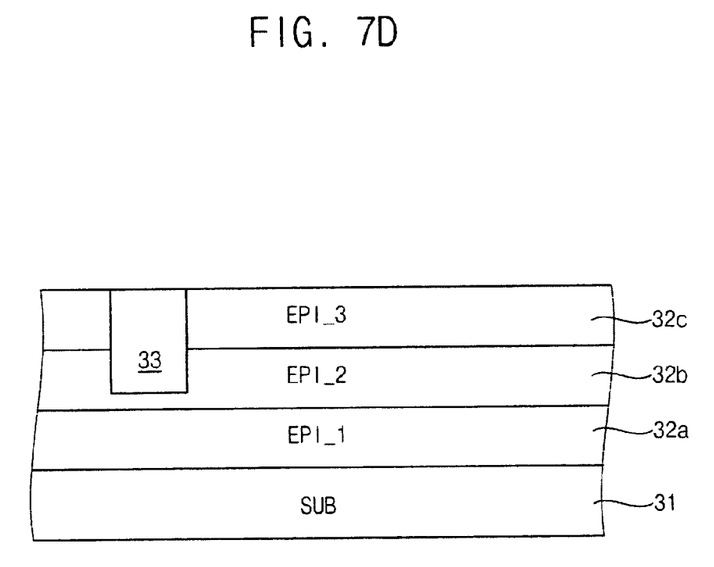
Figure 7E:
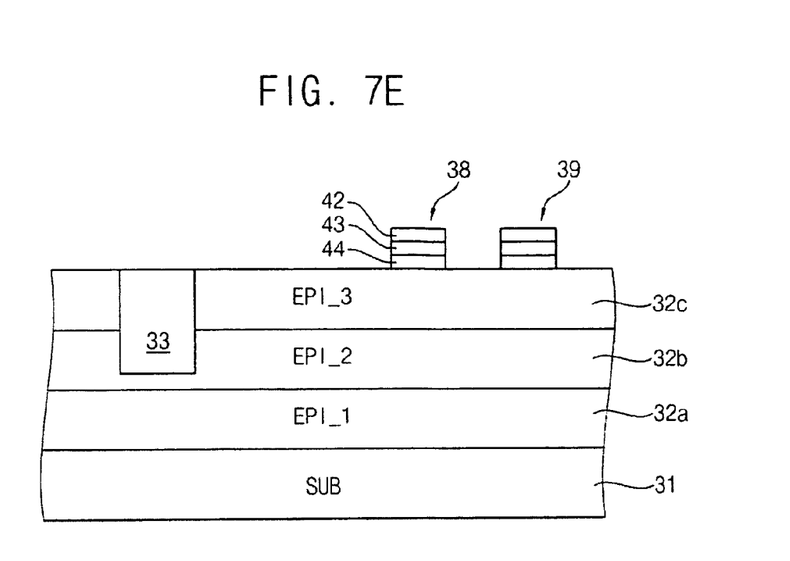

Referring to FIGS. 7A through 7C, forming an epitaxial layer may include forming a first epitaxial layer (EPI_1) 32a of p-type having a first doping concentration on the substrate 31, forming a second epitaxial layer (EPI_2) 32b of the p-type having a second doping concentration that is higher than the first doping concentration on the first epitaxial layer 32a, and forming a third epitaxial layer (EPI_3) 32c of the p-type having a third doping concentration that is lower than the second doping concentration on the second epitaxial layer (EPI_2) 32b. The third doping concentration which the third epitaxial layer (EPI_3) 32c may be equal to or lower than the first doping concentration.

Figure 7F:
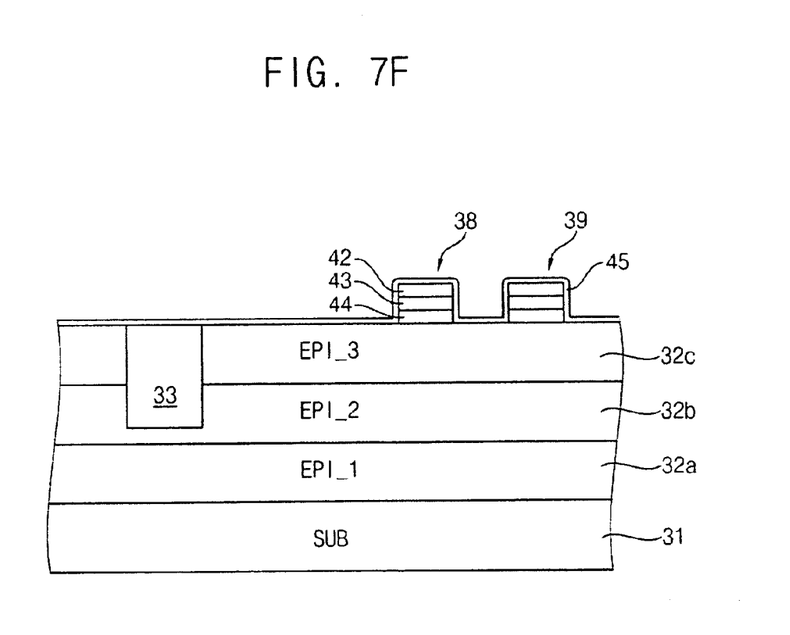

After the epitaxial layers 32a, 32b and 32c are formed, the shallow trench isolation region (STI) 33 may be formed. After STI 33 is formed, a gate electrode of the transfer transistor 38 and a gate electrode of the reset transistor 39 may be formed. Forming the gate electrodes may include forming a first oxide layer 44, forming a conductive layer 43 on the first oxide layer 44, and forming a second oxide layer 42 on the conductive layer 43. After the second oxide layer 42 is formed, side-wall dielectrics 45 may be formed as shown in FIG. 7F.

Figure 7G:
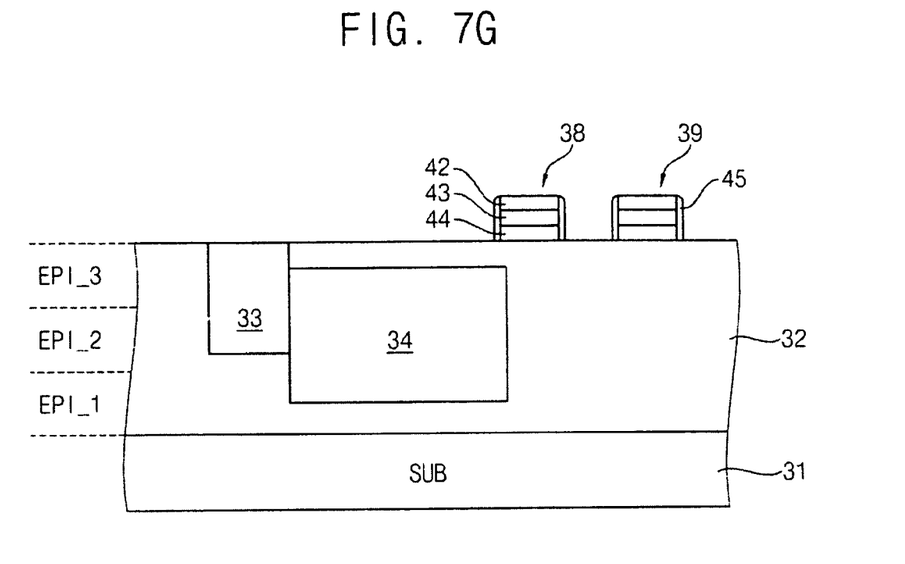
Figure 7H:
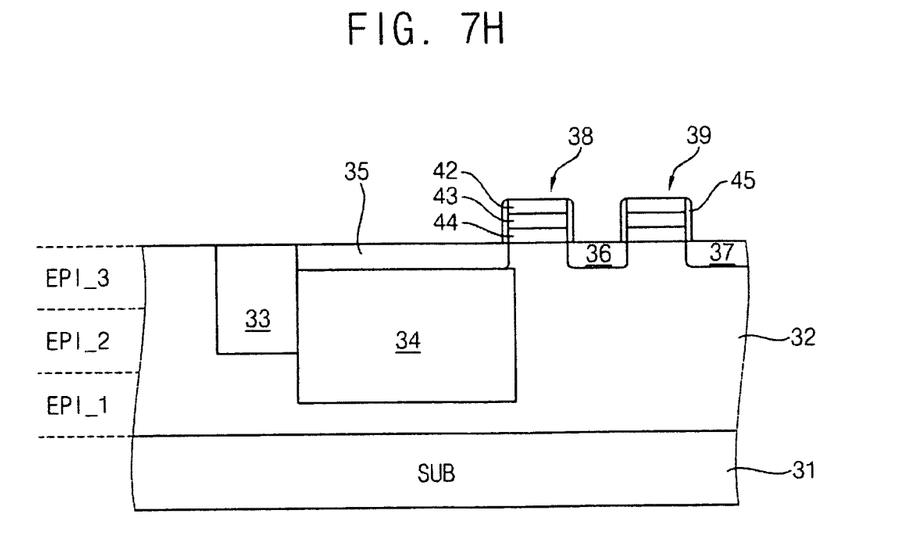

After the side-wall dielectrics 45 are formed, an n-type photo diode region 34 is formed using ion implantation as shown in FIG. 7G. Then, a p-type surface layer 35 may be formed on the n-type photo diode region 34 as shown in FIG. 7H. Then a floating diffusion region 36 and a drain region of the reset transistor 39 may be formed.

In the above, the CMOS image sensor including an epitaxial layer composed of three steps and having a doping concentration profile of embossing shape is described as an example. However, a pixel cell and an image sensor having the pixel cell according to an example embodiment may be applicable to a pixel cell and an image sensor having the pixel cell composed of a plurality of steps and having a doping concentration profile of embossing shape.

Figure 8:
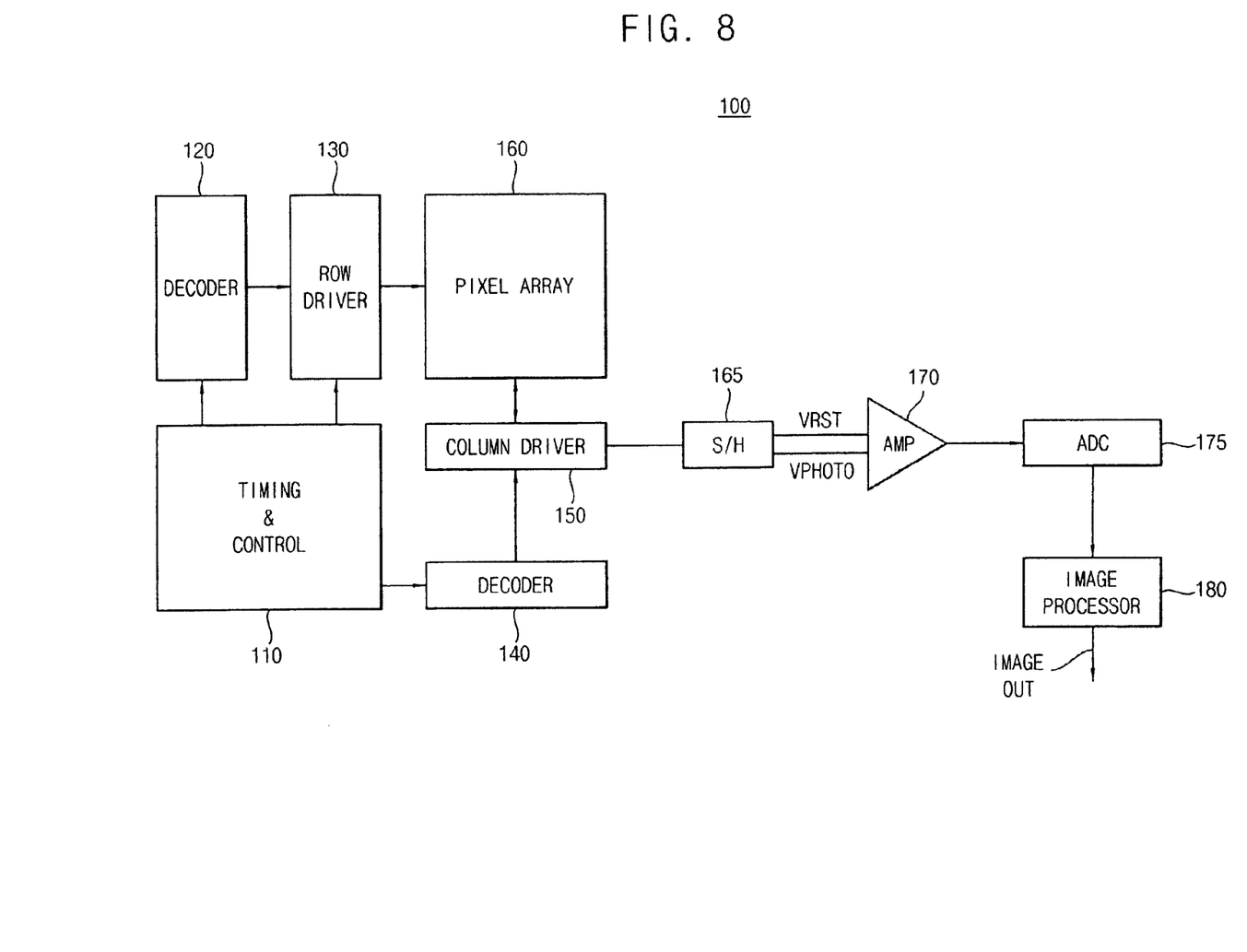
FIG. 8 is a block diagram illustrating a circuit structure of the CMOS image sensor shown in FIG. 2 according to example embodiments.

FIG. 8 is a block diagram depicting an image sensor 100 which illustrates an example of a circuit structure of the CMOS image sensor 20 shown in FIG. 2 according to example embodiments.

Referring to FIG. 8, the CMOS image sensor 100 may include a timing-control circuit 110, a row address decoder 120, a row driver 130, a column address decoder 140, a column driver 150 and a pixel array 160.

As shown in FIGS. 2, 3 and 4, the pixel array 160 may include a substrate 31, an epitaxial layer 32 having a doping concentration profile of embossing shape and composed of a plurality of layers EPI_1, EPI_2 and EPI_3 that are stacked on the substrate 31, and a photo converting device that is formed in the epitaxial layer 32. The photo converting device is formed in the epitaxial layer 32, and may include a photo diode region 34 having an opposite conductivity type to the epitaxial layer 32. When the epitaxial layer 32 is a p-type semiconductor material, the photo diode region 34 may be formed using an n-type semiconductor material.

The doping concentration of the second epitaxial layer EPI_2 may be higher than the doping concentration of the first epitaxial layer EPI_1 and the third epitaxial layer EPI_3. The doping concentration of the third epitaxial layer EPI_3 may be lower than or equal to the doping concentration of the first epitaxial layer EPI_1.

The data of pixel cells in the pixel array 160 may be output row by row. Therefore, the pixel cells in one row of the pixel array 160 may be selected at the same time to output the data of one row in response to a row selecting signal. Further, each of the pixel cells in the selected row may provide a signal corresponding to a received light to an output line of a corresponding column. In the pixel array 160, each column may be a selecting line, and pixel cells of each column may selectively output data in response to a column selecting signal.

The rows in the pixel array 160 may be activated by the row driver 130 in response to an output signal of the row address decoder 120. Column selecting lines may be activated by the column driver 150 in response to an output signal of the column address decoder 140. The timing-control circuit 110 may control the row address decoder 120 and the column address decoder 140 to select a row line and a column line appropriate to a pixel signal output.

Further, the CMOS image sensor 100 may include a sample-and-hold circuit (S/H) 165, a differential amplifier 170, an analog-digital converter (ADC) 175 and an image processor 180. The sample-and-hold circuit 165 may output a pixel reset signal VRST and a pixel image signal VPHOTO in response to an output signal of the column driver 150. The differential amplifier 170 may generate a differential signal (VRST-VPHOTO) for each pixel cell, and the analog-digital converter (ADC) 175 may digitize the differential signal for each pixel cell. The image processor 180 may perform a proper image process for the digitized pixel cell signals to output image data.

In the CMOS image sensor according to an example embodiment shown in FIG. 8, the effective depth of the n-type photo diode region NPD may be formed deeper than the conventional image sensor even if ion implantation is performed using the same energy because the image sensor includes the epitaxial layers EPI_1, EPI_2 and EPI_3 having a doping concentration profile of embossing shape. The image sensor according to example embodiments may not have the neutral region, or the region in which a potential is constant in a vertical direction, because the image sensor may include the first epitaxial layer EPI_1 between the p-type substrate SUB and the second epitaxial layer EPI_2, and the first epitaxial layer EPI_1 has a doping concentration lower than the doping concentration of the p-type substrate SUB and the second epitaxial layer EPI_2.

Therefore, according to example embodiments, the CMOS image sensor 100 shown in FIG. 8 may have little crosstalk between photo converting devices, and may output image data without errors.

Figure 9:
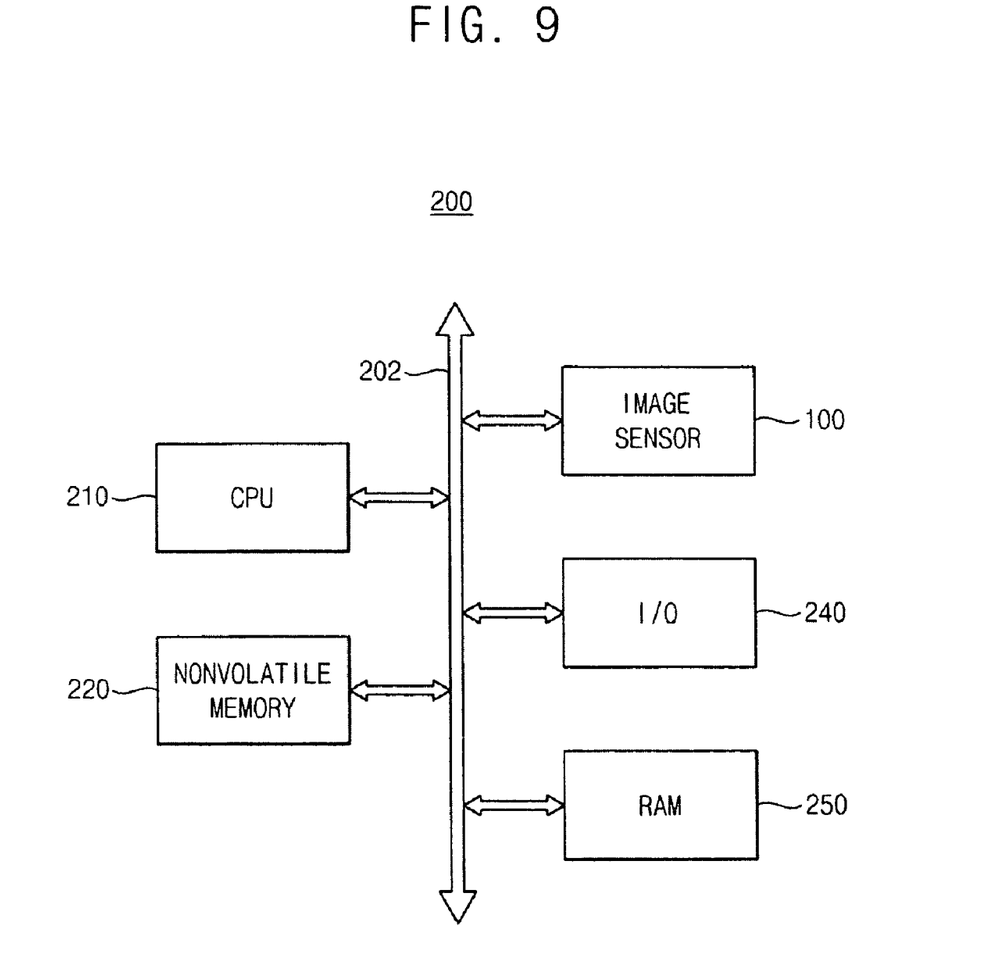
FIG. 9 is a block diagram illustrating a system that includes the CMOS image sensor shown in FIG. 8 according to example embodiments.

FIG. 9 is a block diagram illustrating a system that includes the CMOS image sensor 100 shown in FIG. 8. The system of FIG. 9 may be a computer system, a camera system, a scanner, a car navigation system, a video phone, a security system or a motion detecting system.

Referring to FIG. 9, the system 200 may include a central processing unit (CPU) 210, a non-volatile memory device 220, the image sensor 100, an input/output device (I/O) 240 and a random access memory (RAM) 250. The CPU 210 may communicate with the I/O 240 through a bus 202. The image sensor 230 may communicate with the CPU 210 through the bus 202. Further, the RAM 250 and the non-volatile memory device 220 may communicate with the CPU 210 through the bus 202. The image sensor 100 may be a discrete semiconductor chip or included in the CPU 210 as a circuit block.

The image sensor 100, as shown in FIG. 8, may include a timing-control circuit 110, a row address decoder 120, a row driver 130, a column address decoder 140, a column driver 150 and a pixel array 160.

Referring to FIGS. 1, 2, 3, 4, and 8, the pixel array 160, as shown in FIG. 8, may include a substrate 31, an epitaxial layer 32 having a doping concentration profile of embossing shape and composed of a plurality of layers EPI_1, EPI_2 and EPI_3 that are stacked on the substrate 31, and a photo converting device that is formed in the epitaxial layer 32. The photo converting device 11 may be formed in the epitaxial layer 32, and include a photo diode region 34 having an opposite conductivity type to the epitaxial layer 32. When the epitaxial layer 32 is a p-type semiconductor material, the photo diode region 34 may be formed using an n-type semiconductor material.

The doping concentration of the second epitaxial layer EPI_2 may be higher than the doping concentration of the first epitaxial layer EPI_1 and the third epitaxial layer EPI_3. The doping concentration of the third epitaxial layer EPI_3 may be lower than or equal to the doping concentration of the first epitaxial layer EPI_1.

The system 200 shown in FIG. 9 may include a plurality of pixel cells 10 as shown in FIGS. 1, 2, 3 and 4. In the image sensor 100 of FIG. 9, the effective depth of the n-type photo diode region NPD may be formed deeper than the conventional image sensor even if ion implantation is performed using the same energy because the image sensor 100 may include the epitaxial layers EPI_1, EPI_2 and EPI_3 having a doping concentration profile of embossing shape. The image sensor 100 may not have the neutral region, or the region in which a potential is constant in a vertical direction, because the image sensor 100 may include the first epitaxial layer EPI_1 between the p-type substrate SUB and the second epitaxial layer EPI_2 and the first epitaxial layer EPI_1 may have a doping concentration lower than the doping concentration of the p-type substrate SUB and the second epitaxial layer EPI_2.

Therefore, the system 200 including the CMOS image sensor 100 shown in FIG. 9 may have little crosstalk between photo converting devices, and may output image data without errors.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A pixel cell comprising:
 a substrate; an epitaxial layer having a doping concentration profile of an embossing shape, the epitaxial layer including at least one layer stacked on the substrate; and
 a photo converting device in the epitaxial layer;
 wherein the epitaxial layer includes,
 a first epitaxial layer of a first conductivity type on the substrate and having a first doping concentration,
 a second epitaxial layer of the first conductivity type on the first epitaxial layer and having a second doping concentration that is higher than the first doping concentration, and
 a third epitaxial layer of the first conductivity type on the second epitaxial layer and having a third doping concentration that is lower than the second doping concentration, and
 wherein the second epitaxial layer is between the first epitaxial layer and the third epitaxial layer.

2. The pixel cell of claim 1, wherein the photo converting device in the epitaxial layer does not include a neutral region that has a constant potential in a vertical direction.

3. The pixel cell of claim 1, wherein the photo converting device includes a photo-diode region in the epitaxial layer and has a conductivity type opposite to a conductivity type of a remainder of the epitaxial layer.

4. The pixel cell of claim 3, wherein the photo converting device further includes a surface layer on the photo-diode region and has a conductivity type identical to the conductivity type of the epitaxial layer.

5. The pixel cell of claim 1, wherein the third doping concentration is lower than the first doping concentration.

6. The pixel cell of claim 1, wherein the substrate has the first conductivity type.

7. The pixel cell of claim 1, wherein the photo converting device is a photo-diode.

8. The pixel cell of claim 1, further comprising:
 a transfer transistor configured to transfer charge generated by the photo converting device to a first node;
 a source follower transistor configured to amplify a voltage signal of the first node; and
 a reset transistor configured to reset the voltage signal of the first node.

9. The pixel cell of claim 8, further comprising: a row selecting transistor configured to output an output signal of the source follower transistor to an output terminal in response to a selecting signal.

10. An image sensor comprising:
 a row driver configured to generate a row selecting signal;
 a column driver configured to generate column selecting signal; and a pixel array configured to operate in response to the row selecting signal and the column selecting signal, the pixel array including at least one pixel cell of claim 1.

11. The image sensor of claim 10, wherein the photo converting device in the epitaxial layer does not include a neutral region that has a constant potential in a vertical direction.

12. The image sensor of claim 10, wherein the photo converting device includes a photo-diode region in the epitaxial layer and has a conductivity type opposite to a conductivity type of a remainder of the epitaxial layer.

13. The image sensor of claim 10, wherein the third doping concentration is lower than the first doping concentration.

14. The image sensor of claim 10, further comprising:
 a sample-and-hold circuit configured to output a pixel reset signal and a pixel image signal in response to an output signal of the column driver;
 a differential amplifier configured to generate differential signals for pixel cells based on the pixel reset signal and the pixel image signal;
 an analog-digital converter configured to digitalize the differential signals; and
 an image processor configured to perform appropriate image processing with respect to the digitalized differential signals to output image data.

15. A system comprising: a processor; and an image sensor coupled to the processor, the image sensor including at least one pixel of claim 1.

16. A method of forming a pixel cell, comprising:
 forming a substrate;
 forming an epitaxial layer having a doping concentration profile of embossing shape, the epitaxial layer including at least one layer stacked on the substrate; and
 forming a photo converting device in the epitaxial layer, wherein the forming an epitaxial layer includes
 forming a first epitaxial layer having a first conductivity type and a first doping concentration on the substrate;
 forming a second epitaxial layer having the first conductivity type and a second doping concentration that is higher than the first doping concentration on the first epitaxial laver; and
 forming a third epitaxial layer having the first conductivity type and a third doping concentration that is lower than the second doping concentration on the second epitaxial layer, and
 wherein the second epitaxial layer is between the first epitaxial layer and the third epitaxial layer.

17. The method of forming a pixel cell of claim 16, wherein the third doping concentration is lower than the first doping concentration.

* * * * *